United States Patent [19]
Park

[11] Patent Number: 5,536,671
[45] Date of Patent: Jul. 16, 1996

[54] METHOD FOR FABRICATING CAPACITOR OF A SEMICONDUCTOR DEVICE

[75] Inventor: Sang H. Park, Kyungki-do, Rep. of Korea

[73] Assignee: Hyundai Electronics Industries, Co., Ltd., Rep. of Korea

[21] Appl. No.: 365,344

[22] Filed: Dec. 28, 1994

[30] Foreign Application Priority Data

Dec. 28, 1993 [KR] Rep. of Korea .................. 93-30479
Dec. 31, 1993 [KR] Rep. of Korea .................. 93-31922

[51] Int. Cl.$^6$ ........................................... H01L 21/8242
[52] U.S. Cl. ........................... 437/52; 437/60; 437/919
[58] Field of Search ........................... 437/47, 48, 52, 437/60, 919; 257/306

[56] References Cited

U.S. PATENT DOCUMENTS

| | | | |
|---|---|---|---|
| 5,143,861 | 9/1992 | Turner | 437/52 |
| 5,346,844 | 9/1994 | Cho et al. | 437/52 |
| 5,364,809 | 11/1994 | Kwon et al. | 437/52 |
| 5,364,811 | 9/1994 | Ajiica et al. | 437/52 |

*Primary Examiner*—Tom Thomas
*Attorney, Agent, or Firm*—Merchant, Gould, Smith, Edell, Welter & Schmidt

[57] ABSTRACT

A method for fabricating a capacitor of a dynamic random access memory, capable of achieving a very high integration degree and yet obtaining a sufficient capacitance. The method includes the steps of: forming transistors on a silicon substrate such that adjacent transistors are spaced from each other; forming an insulating film over the entire exposed surface of the resulting structure; forming bit line contact holes in the resulting structure; burying a conduction material in each of the bit line contact holes, thereby forming a bit line; etching portions of the insulating film respectively remaining on the bit line thereby exposing an upper surface and side surfaces of the bit line depositing an insulating film over the bit line to insulate the bit line from a conduction layer to be formed for a storage electrode over the bit line; forming a contact hole for the storage electrode in the resulting structure; forming the storage electrode electrically connected to each corresponding one of the transistors and overlapped with an upper surface of the bit line; and forming a dielectric film and a plate electrode over the storage electrode.

11 Claims, 7 Drawing Sheets

5,536,671

METHOD FOR FABRICATING CAPACITOR OF A SEMICONDUCTOR DEVICE

BACKGROUND OF THE INVENTION

1. Field of the Invention

The present invention relates to a method for fabricating a capacitor of a semiconductor device, and more particularly, to a method for fabricating a capacitor of a dynamic random access memory (DRAM), capable of increasing the capacitance of the capacitor.

2. Description of the Prior Art

Generally, an increased integration degree of a semiconductor device such as a DRAM inevitably involves a reduction in the surface area of a unit cell. Such a reduction in the surface area of a unit cell results in a reduction in the unit cell area of the DRAM. In spite of the reduced unit cell area, however, the capacitance of capacitors used for the DRAM should be kept at a value of about 40 famto Farads.

There have been proposed various capacitor structures for obtaining an appropriate capacitance and yet achieving a high integration. Of these capacitor structures, the most representative one is the stack structure.

A DRAM including a capacitor of a conventional stack structure will be described in conjunction with FIG. 5.

The capacitor structure shown in FIG. 5 is fabricated in the following manner. An element isolation film 52 is formed on a portion of a silicon substrate 51 corresponding to a field region. Thereafter, a transistor is formed on a portion of the silicon substrate 51 corresponding to an active region. The transistor includes a gate oxide film 53, a gate electrode 54, and a source/drain electrode 55. Over the element isolation film 52, a word line 54A is formed such that it passes through the field region. Over the entire exposed surface of the resulting structure, an insulating oxide film 57 is formed. Subsequently, the insulating oxide film 57 is partially etched so as to expose a predetermined storage electrode contact region, that is, the source/drain electrode 55. A storage electrode 58 is then formed such that it is in contact with the exposed source/drain electrode 55. Over the storage electrode 58, a dielectric film 59 is then formed. Finally, a plate electrode 60 is formed over the entire exposed surface of the resulting structure. In FIG. 5, the reference numeral 56 denotes insulating film spacers respectively formed on side walls of the gate electrode 54.

In the above-described conventional method, the surface area of the storage electrode is increased by increasing the area of the storage electrode or by increasing the thickness of the storage electrode at edge portions of the storage electrode.

As the DRAM has a much higher integration degree, the above-mentioned simple stack structure obtains an insufficient capacitance.

SUMMARY OF THE INVENTION

Therefore, an object of the present invention is to provide a method for fabricating a capacitor, capable of achieving a very high integration and yet obtaining a sufficient capacitance.

In order to accomplish this object, the present invention provides a method fox fabricating a capacitor of a semiconductor device, wherein a bit line is formed prior to the formation of a storage electrode in such a manner that it exhibits an increased topology wherein it is in contact with a source/drain, thereby causing the subsequently formed storage electrode to over lap with the hit line and, thus, to have an increased surface area.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 1A to 1D are sectional views respectively illustrating steps fox fabricating a DRAM capacitor in accordance with a first embodiment of the present invention.

Figure 1A:
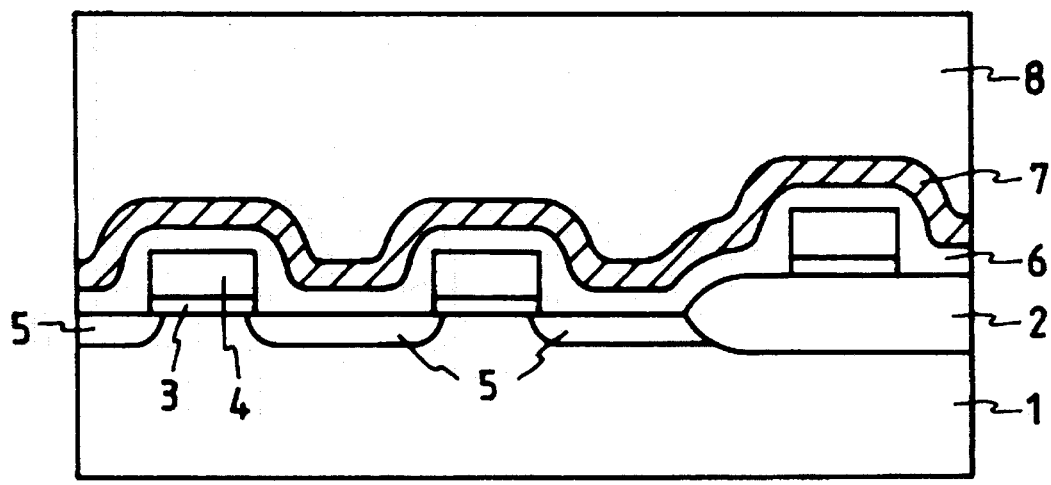
FIGS. 1A to 1D are sectional views respectively illustrating a method for fabricating a DRAM capacitor in accordance with a first embodiment of the present invention.
Figure 1B:
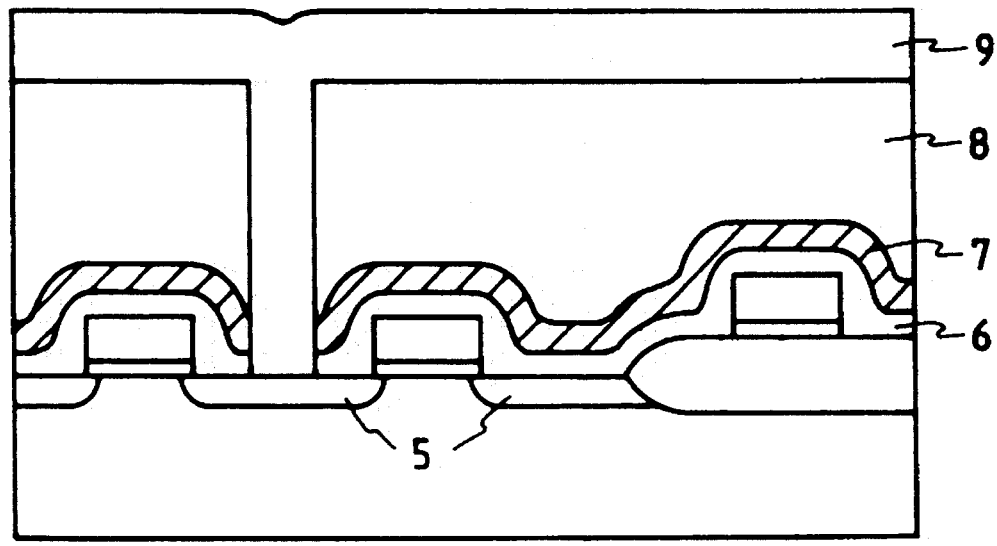

In accordance with this embodiment, first, a metal oxide semiconductor field effect transistor (MOSFET) is formed on a silicon substrate 1 formed with an element isolation film 2, as shown in FIG. 1A. The MOSFET includes source/drain 5, a gate oxide film 3 and gate electrodes 4. Over the entire exposed surface of the resulting structure, an insulating oxide film 6, a nitride film 7 and an insulating film 8 for planarization are formed in a sequential manner.

using a storage electrode contact mask (not shown), predetermined portions of the planarizing insulating film 8, nitride film 7 and insulating oxide film 6 are then respectively etched so as to form contact holes for exposing the source/drain 5, as shown in FIG. 1B. Over the entire exposed surface of the resulting structure, a first polysilicon layer 9 is then formed.

Figure 1C:
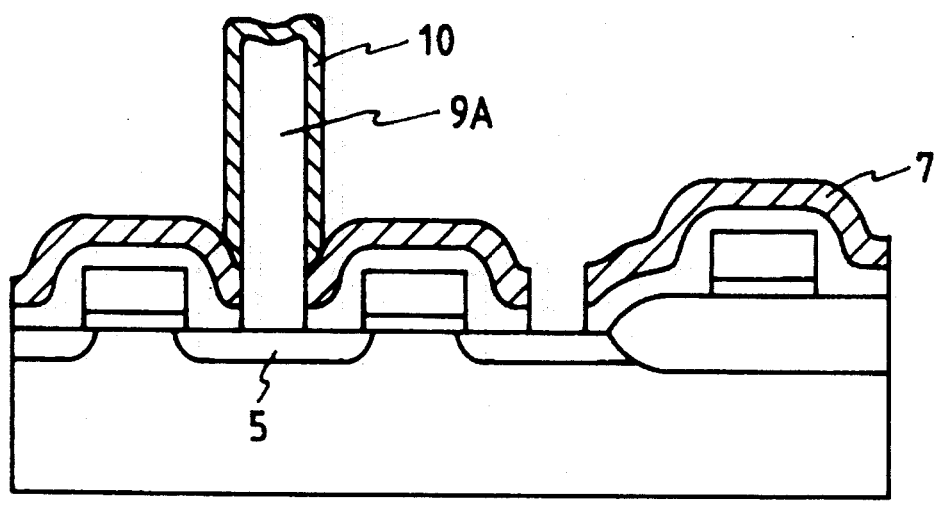

Thereafter, the first polysilicon layer 9 is blanket-etched under a condition that the planarizing insulating film 8 is used as an etch stop layer, as shown in FIG. 1C. As a result, a bit line 9A having a predetermined height is formed. The bit line 9A is in contact with a selected one of the source/drain 5. The remaining planarizing insulating film 8 is completely removed using HF. A silicide film 10 made from a transition metal film is formed on the exposed surface of the bit line 9A.

Figure 1D:
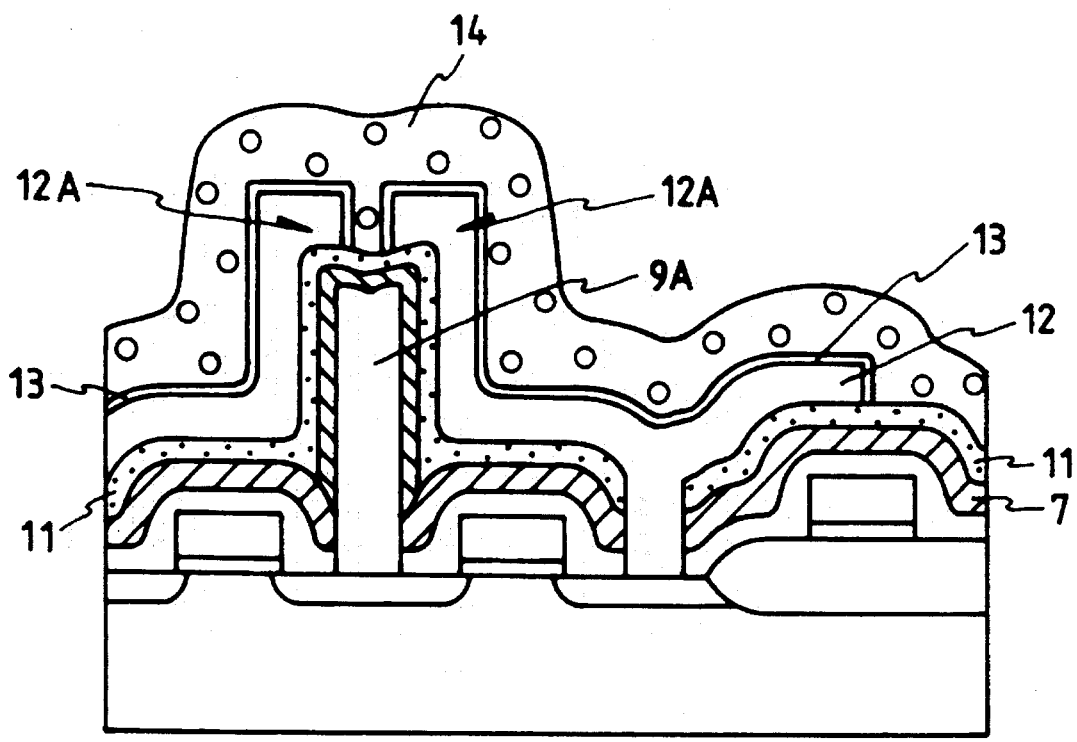

Over the entire exposed surface of the resulting structure, an oxide film 11 is then formed, as shown in FIG. 1D. The oxide film 11 is subjected to an etching process using a storage electrode contact mask (not shown) so as to form a contact hole for exposing the other source/drain 5. Over the entire exposed surface of the resulting structure, a second polysilicon layer 12 for a storage electrode is then deposited. The second polysilicon layer 12 is subjected to an etching process using a storage electrode mask (not shown) so as to remove its predetermined portion. As a result, the remaining portion of the second polysilicon layer 12 forms a storage electrode 12A which overlaps with the upper surface of the bit line 9A. A capacitor dielectric film 13 is then deposited over the storage electrode 12A. Finally, a plate electrode 14 is deposited over the entire exposed surface of the resulting structure. By referring to FIG. 1D, it can be found that the storage electrode 12A has an increased surface area by virtue of the fact that it overlaps with the upper surface of bit line 9A while being isolated from another neighboring storage electrode 12A at a region defined over the upper surface of the bit line 9A.

Figure 2A:
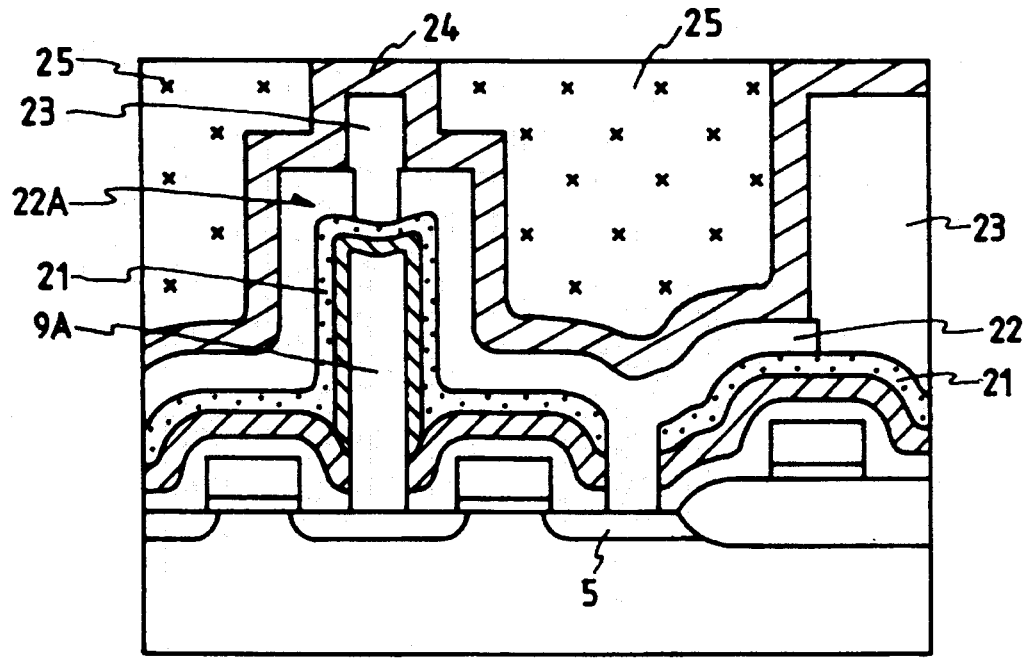
FIGS. 2A and 2B are sectional views respectively illustrating a method for fabricating a DRAM capacitor in accordance with a second embodiment of the present invention.
Figure 2B:
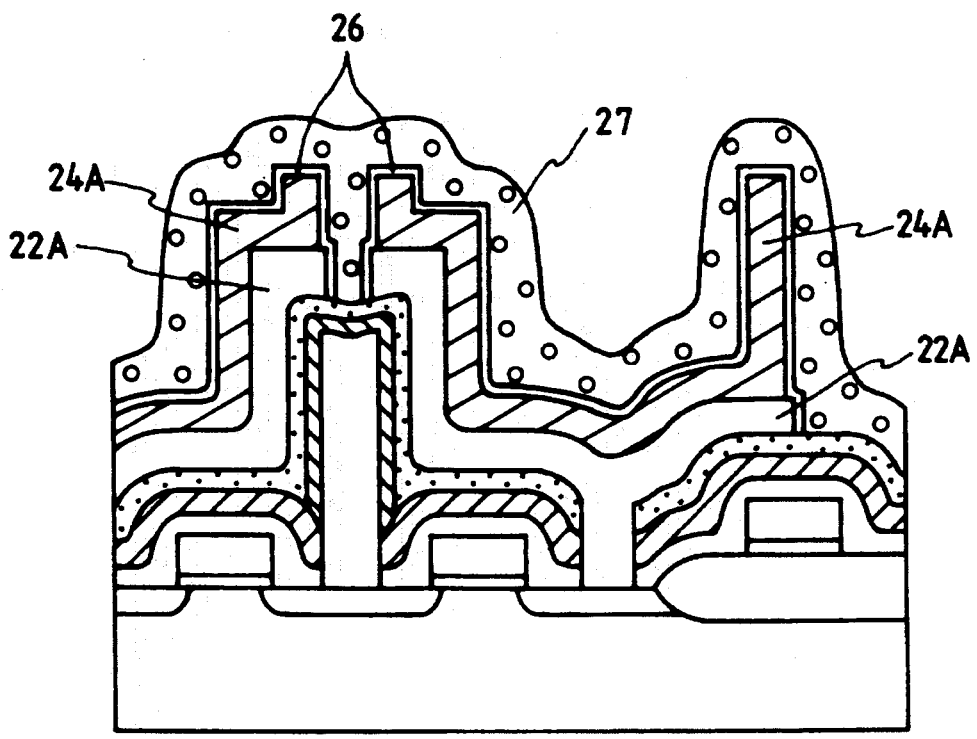

FIGS. 2A and 2B are sectional views respectively illustrating the steps for fabricating a DRAM capacitor having an increased storage electrode surface area in accordance with a second embodiment of the present invention.

In accordance with the second embodiment, the same steps as those shown in FIGS. 1A to 1C are carried out to obtain a structure including the bit line 9A and the silicide film 10. Over the entire exposed surface of the obtained structure, a nitride film 21 is then deposited, as shown in FIG. 2A. Thereafter, the nitride film 21 is subjected to an etching process using a storage electrode contact mask (not shown) so as to form a contact hole fox exposing the other source/drain 5. Over the entire exposed surface of the resulting structure, a second polysilicon layer 22 for a storage electrode is then deposited. The second polysilicon layer 22 is subjected to an etching process using a storage electrode mask (not shown) so as to remove its predetermined portion. As a result, the remaining portion of the second polysilicon layer 22 forms a first storage electrode 22A which overlaps with the upper surface of the bit line 9A. Over the entire exposed surface of the resulting structure, a thick chemical vapor deposition (CVD) oxide film 23 is then deposited. Subsequently, the CVD oxide film 23 is patterned to form a CVD oxide film pattern which exposes the first storage electrode 22A while overlapping with the edges of the first storage electrode 22A. A third polysilicon layer 24 for a storage electrode is then deposited over the entire exposed surface of the resulting structure. Thereafter, a photoresist film 25 fills a recess defined by the third polysilicon layer 24. As a result, the third polysilicon layer 24 is partially exposed.

The exposed portion of the third polysilicon layer 24 is then etched, thereby forming a second storage electrode 24A which has a cylindrical shape and is electrically connected to the first storage electrode 22A, as shown in FIG. 2B. Thereafter, the photoresist film 25 and the CVD oxide film 23 are removed. Over the first and second storage electrode 22A and 24A, a capacitor dielectric film 26 is formed. Finally, a plate electrode 27 is deposited over the entire exposed surface of the resulting structure. Thus, a capacitor is fabricated.

FIGS. 3A to 3D are sectional views respectively illustrating steps for fabricating a DRAM capacitor in accordance with a third embodiment of the present invention. In. FIGS. 3A to 3D, elements respectively corresponding to those in FIGS. 1A to 1D are denoted by the same reference numerals.

Figure 3A:
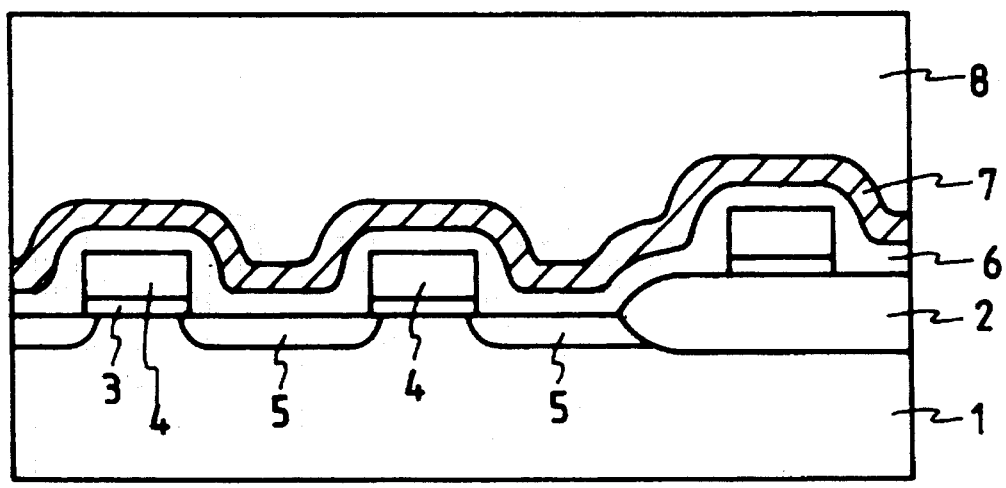
FIGS. 3A to 3D are sectional views respectively illustrating a method for fabricating a DRAM capacitor in accordance with a third embodiment of the present invention.

In accordance with this embodiment, first, a transistor is formed on a silicon substrate 1 formed with an element isolation film 2, as shown in FIG. 3A. The transistor includes a gate oxide film 3, gate electrodes 4 and source/drain 5. Over the entire exposed surface of the resulting structure, an insulating oxide film 6, a nitride film 7 and an insulating film 8 for planarization are formed in a sequential manner. The formation of the planarizing oxide film 8 is achieved by depositing a tetra ethyl ortho silicate (TEOS) film to a predetermined thickness over the nitride film 7 and then blanket-etching the TEOS film to carry out the planarization.

Figure 3B:
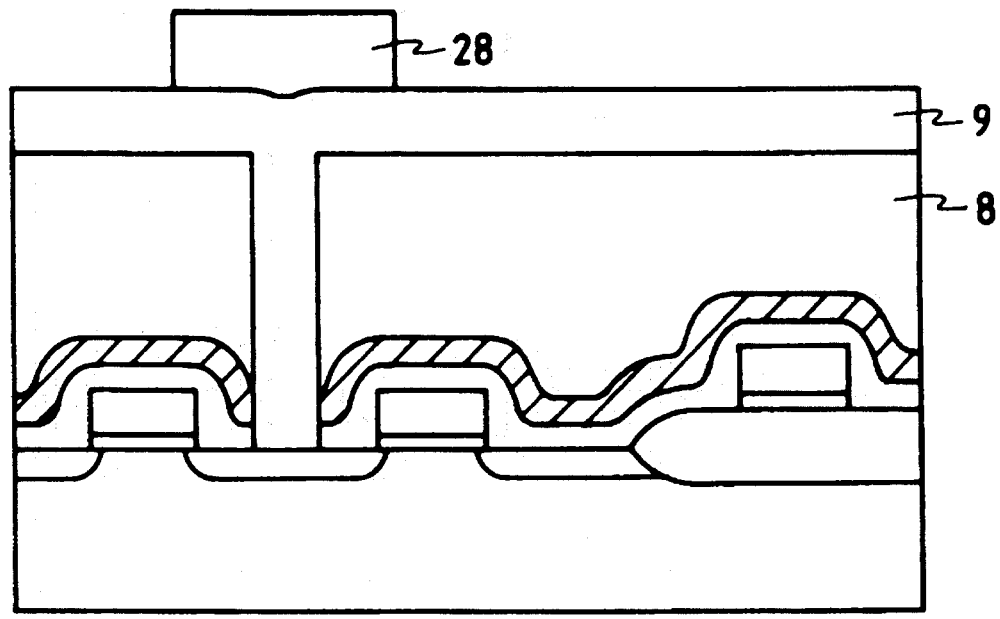

Using a bit line contact mask (not shown), predetermined portions of the planarizing insulating film 8, nitride film 7 and insulating oxide film 6 are then etched so as to form a contact hole for exposing one of the source/drains 5, as shown in FIG. 3B. Over the entire exposed surface of the resulting structure, a first polysilicon layer 9 fox a bit line is then formed. Subsequently, a photoresist film pattern 28 is formed on the first polysilicon layer 9.

Figure 3C:
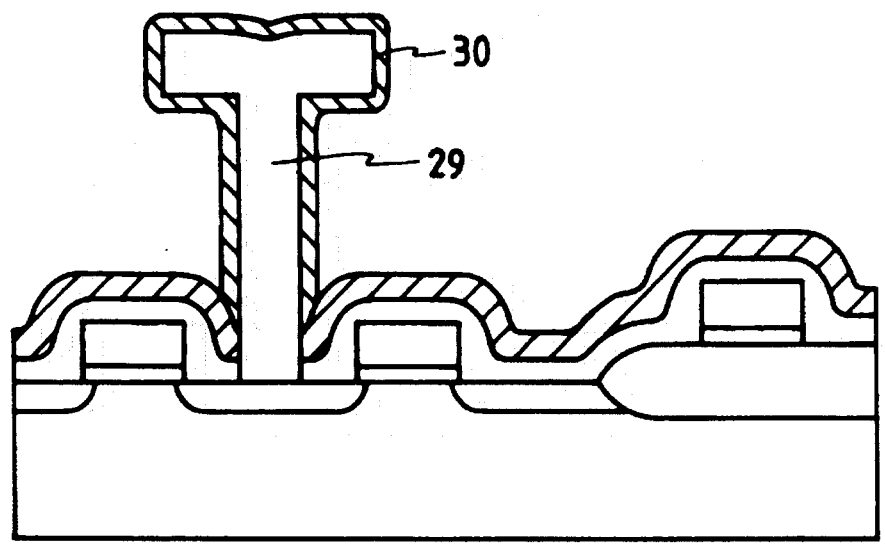

Thereafter, an exposed portion of the first polysilicon layer is etched using the photoresist film pattern 28, thereby forming a bit line 29, as shown in FIG. 3C. The planarizing oxide film 8 is removed using a wet etching process under a condition that the nitride film 7 is used as an etch stop layer. On the resulting structure, a transition metal film (not shown) is then selectively deposited. The transition metal film is annealed, thereby forming a silicide film 30 on the exposed surface of the bit line 29.

Figure 3D:
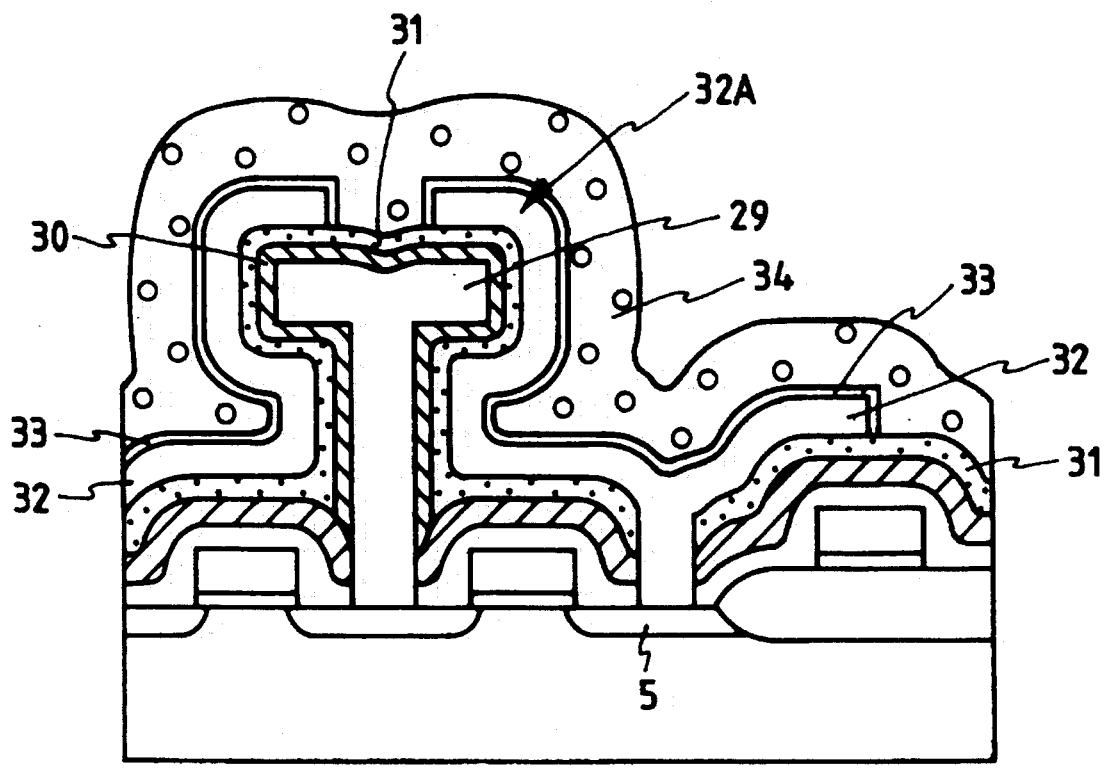

Over the entire exposed surface of the resulting structure, a thermal oxide film 31 is then formed, as shown in FIG. 3D. Thereafter, predetermined portions of the thermal oxide film 31, nitride film 7 and insulating film 6 are etched by use of an etching process using a storage electrode contact mask (not shown), thereby forming a contact hole for exposing the other source/drain 5. Over the entire exposed surface of the resulting structure, a second polysilicon layer 32 for a storage electrode is then formed. The second polysilicon layer 32 is subjected to an etching process using a storage electrode mask (not shown) so as to remove its predetermined portion. As a result, the remaining portion of the second polysilicon layer 32 forms a storage electrode 32A. A capacitor dielectric film 33 is then deposited over the storage electrode 32A. Finally, a plate electrode 34 is deposited over the entire exposed surface of the resulting structure.

The capacitor structure obtained in accordance with the third embodiment includes the bit line 29 having an increased upper surface, as compared to that in accordance with the first embodiment. In other words, the bit line 29 has portions laterally protruded at its upper portion. By virtue of these laterally protruded portions of the bit line 29, the storage electrode 32A has an increased surface area.

Figure 4A:
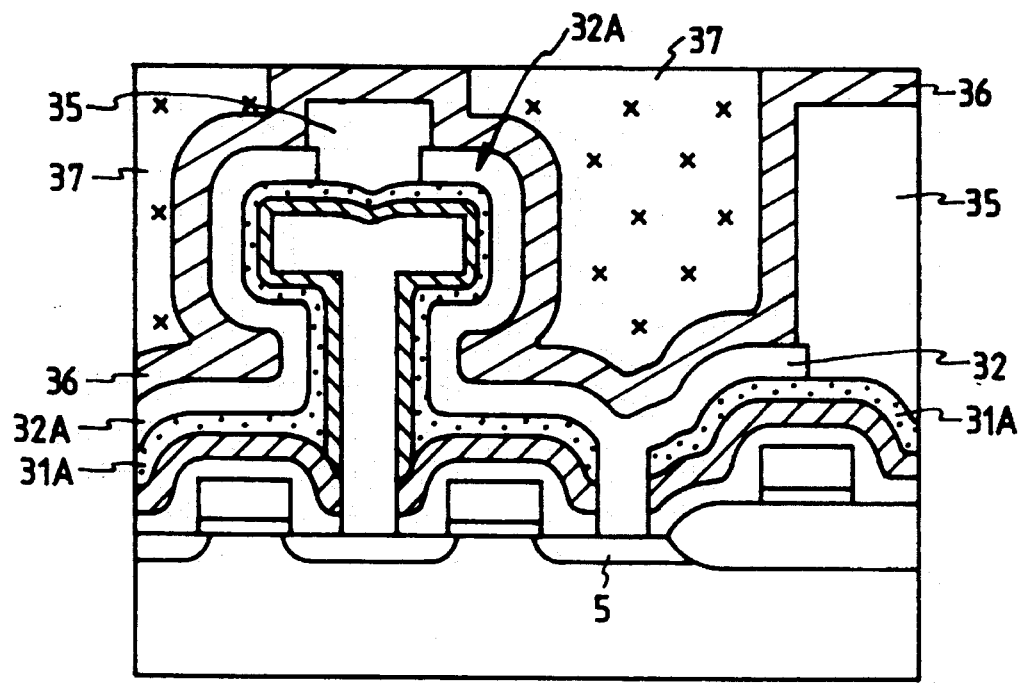
FIGS. 4A and 4B are sectional views respectively illustrating a method for fabricating a DRAM capacitor in accordance with a fourth embodiment of the present invention.
Figure 4B:
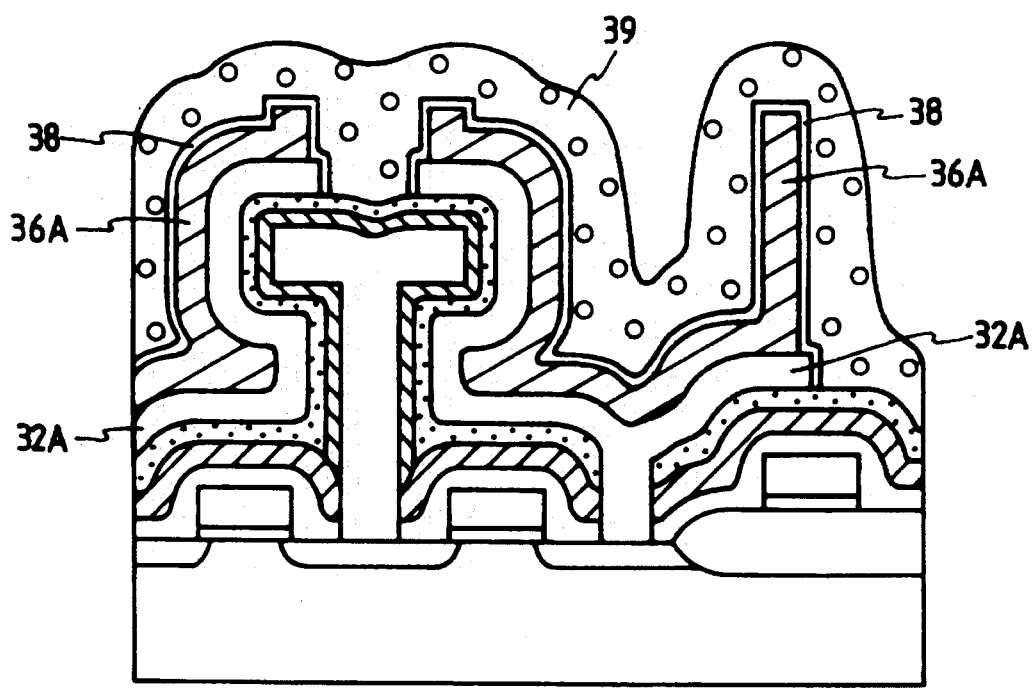
Figure 5:
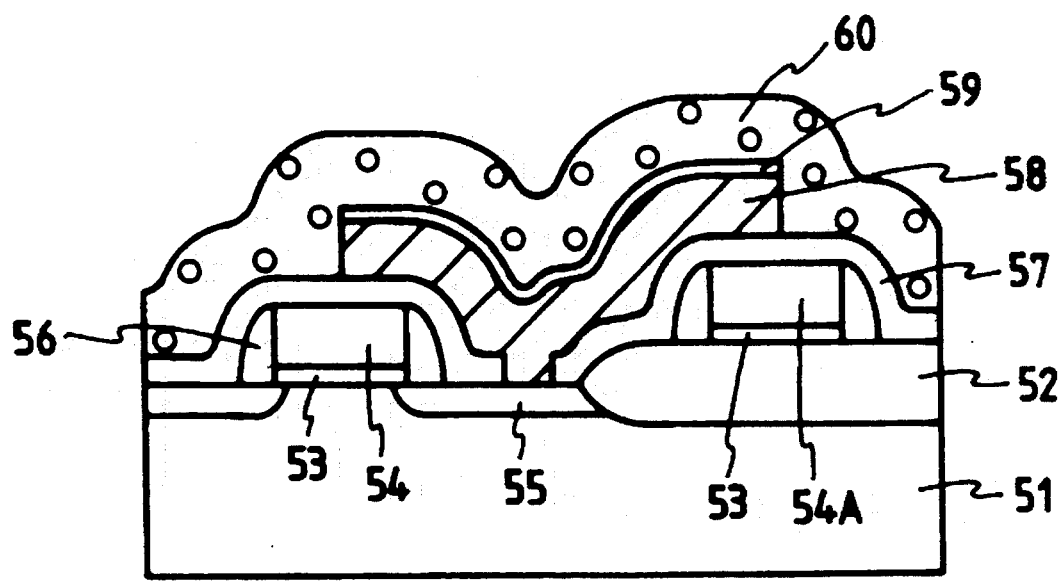
FIG. 5 shows a DRAM including a capacitor of a conventional stack structure.

FIGS. 4A and 4B are sectional views respectively illustrating steps for fabricating a DRAM capacitor in accordance with a fourth embodiment of the present invention.

In accordance with the fourth embodiment, the same steps as those shown in FIGS. 3A to 3C are carried out. Over the entire exposed surface of the resulting structure, a nitride film 31A is then formed, as shown in FIG. 4A. Thereafter, the nitride film 31A is subjected to an etching process using a storage electrode contact mask (not shown) so as to form a contact hole for exposing the other source/drain 5. Over the entire exposed surface of the resulting structure, a second polysilicon layer 32 for a storage electrode is then formed. The second polysilicon layer 32 is subjected to an etching process using a storage electrode mark (not shown) so as to remove its predetermined portion. As a result, the remaining portion of the second polysilicon layer 32 forms a first storage electrode 32A. Over the entire exposed surface of the resulting structure, a thick CVD oxide film 35 is then deposited. Subsequently, the CVD oxide film 35 is etched to form a trench opening the central portion of the first storage electrode 32A. A third polysilicon layer 36 for a storage electrode is then deposited over the entire exposed surface of the resulting structure. Thereafter, a photoresist film 37 fills a recess of the third polysilicon layer 36 defined in the trench. As a result, the third polysilicon layer 36 is partially exposed at its upper surface.

The exposed portion of the third polysilicon layer 36 is then etched using the photoresist film 37 as a mask, thereby forming a second storage electrode 36A, as shown in FIG. 4B. Thereafter, the photoresist film 37 and the CVD oxide film 35 are removed. The first and second storage electrodes 32A and 36A constitute a storage electrode. Over the entire exposed surface of the storage electrode, a dielectric film 38 is formed. Finally, a plate electrode 39 is deposited over the entire exposed surface of the resulting structure.

By referring to FIG. 4E, it can he found that the storage electrode has a composite structure including the structure of FIG. 3 and the cylindrical storage electrode structure. By virtue of this composite structure, the storage electrode has a more increased surface area.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor of a dynamic random access memory, comprising the steps of:

forming transistors on a silicon substrate such that adjacent transistors are spaced from each other;

forming a first insulating film over the transistors;

forming bit line contact holes in the first insulating film;

burying a conductive material in each of the bit line contact holes, thereby forming a bit line;

etching portions of the first insulating film thereby exposing an upper surface and side surfaces of the bit line;

depositing a second insulating film over the bit line;

forming a contact hole in the insulating film;

forming a storage electrode electrically connected to each corresponding one of the transistors and overlapped with the upper surface of the bit line; and forming a dielectric film and a plate electrode over the storage electrode.

2. A method in accordance with claim 1, wherein the first insulating film formed over the transistors has a multilayer structure.

3. A method in accordance with claim 2, wherein the insulating film having the multilayer structure comprises an oxide film, a nitride film and an oxide film for planarization.

4. A method in accordance with claim 1, further comprising the step of forming a silicide film over the bit line just after the formation of the bit line.

5. A method in accordance with claim 1, wherein the formation of the bit line is carried out by depositing a polysilicon film after the formation of the bit line contact holes, and then fully etching the polysilicon film until the first insulating film disposed beneath the polysilicon film is exposed.

6. A method in accordance with claim 1, wherein the formation of the bit line is carried out by depositing a polysilicon film after the formation of the bit line contact holes, forming a photoresist film pattern for a bit line mask on the polysilicon film, and dry etching an exposed portion of the polysilicon film.

7. A method for fabricating a capacitor of a dynamic random access memory, comprising the steps of:

forming transistors on a silicon substrate such that adjacent transistors are spaced from each other;

forming a first insulating film over the transistors;

forming bit line contact holes in the first insulating film;

forming a bit line connected to each corresponding one of the transistors through each corresponding one of the bit line contact holes;

depositing a second insulating film over the bit line;

forming a contact hole in the second insulating film;

forming a first storage electrode in the contact hole and on the second insulating film and to electrically connect each corresponding one of the transistors and overlap with an upper surface of the bit line;

forming a third insulating film over the first storage electrode, and removing a portion of the third insulating film disposed over the first storage electrode, thereby forming a trench;

depositing a conducting layer for the first storage electrode and then filling a photoresist film in the trench to create a photoresist film covered portion and an exposed portion;

etching the exposed portion of the conductive layer, thereby forming a second storage electrode having a cylindrical structure; and removing the photoresist film and the third insulating film, forming a dielectric film over the first and second storage electrodes, and then forming a plate electrode.

8. A method in accordance with claim 7, wherein the first insulating film formed over the transistors has a multilayer structure.

9. A method in accordance with claim 7, further comprising the step of forming a silicide film over the bit line just after the formation of the bit line.

10. A method in accordance with claim 7, wherein the formation of the bit line is carried out by depositing a polysilicon film after the formation of the bit line contact holes, and then fully etching the polysilicon film until the first insulating film disposed beneath the polysilicon film is exposed.

11. A method in accordance with claim 7, wherein the formation of the bit line is carried out by depositing a polysilicon film after the formation of the bit line contact holes, forming a photoresist film pattern for a bit line mask on the polysilicon film, and dry etching an exposed portion of the polysilicon film.

* * * * *